United States Patent [19]

Nysen et al.

[11] Patent Number: 5,095,240

[45] Date of Patent: Mar. 10, 1992

[54] INDUCTIVELY COUPLED SAW DEVICE AND METHOD FOR MAKING THE SAME

[75] Inventors: Paul A. Nysen, Randwick, Australia; Jon L. Nagel, Cupertino; Richard D. Smith, Saratoga, both of Calif.

[73] Assignee: X-Cyte, Inc., Mountain View, Calif.

[21] Appl. No.: 434,232

[22] Filed: Nov. 13, 1989

[51] Int. Cl.$^5$ .............................................. H01L 41/08
[52] U.S. Cl. ........................................ 310/313 R; 342/44
[58] Field of Search ................ 310/313; 333/150, 154, 333/193, 195; 342/44, 51

[56] References Cited

U.S. PATENT DOCUMENTS

| | | | |
|---|---|---|---|
| 3,706,904 | 12/1972 | Cole et al. | 310/313 R U X |
| 3,961,290 | 6/1976 | Moore | 310/313 R |
| 4,059,831 | 11/1977 | Epstein | 342/44 |
| 4,096,477 | 6/1978 | Epstein et al. | 342/44 |
| 4,213,104 | 7/1980 | Cullen et al. | 310/313 R X |
| 4,242,671 | 12/1980 | Plows | 310/313 R X |
| 4,422,055 | 12/1983 | Cullen et al. | 310/313 R X |
| 4,625,184 | 11/1986 | Nitsuma et al. | 310/313 R X |
| 4,699,682 | 10/1987 | Takishima | 310/313 R X |
| 4,737,789 | 4/1988 | Nysen | 342/51 |
| 4,737,790 | 4/1988 | Skeie et al. | 342/51 |
| 4,845,397 | 7/1989 | Herrick et al. | 310/313 R |
| 4,931,664 | 6/1990 | Knoll | 342/51 X |
| 4,933,588 | 6/1990 | Greer | 310/313 R X |
| 4,951,057 | 8/1990 | Nagel | 342/51 |

FOREIGN PATENT DOCUMENTS

| | | | |
|---|---|---|---|
| 0147317 | 7/1987 | Japan | 310/313 R |
| 0263809 | 10/1988 | Japan | 310/313 R |

*Primary Examiner*—Mark O. Budd
*Attorney, Agent, or Firm*—Sprung Horn Kramer & Woods

[57] ABSTRACT

An apparatus for coupling energy into and out of a SAW device which can serve as a transponder in a "passive interrogator label system". The device includes a conductive loop deposited on the active surface of the piezoelectric substrate which is electrically connected at its ends to the two transducer terminals of the SAW. The conductive loop forms an inductive element for coupling energy into and out of the SAW device. The active surface of the device is protected by a non-conductive cover (e.g. glass) adhered to the surface.

28 Claims, 8 Drawing Sheets

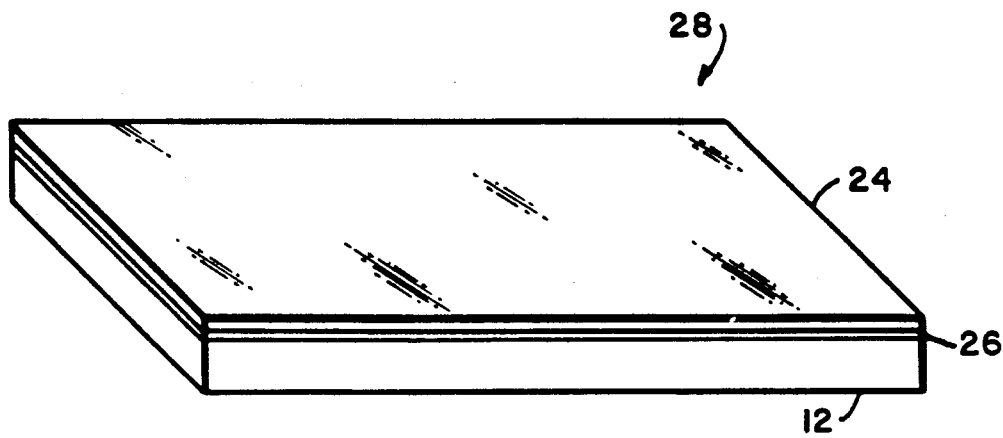
FIG.7
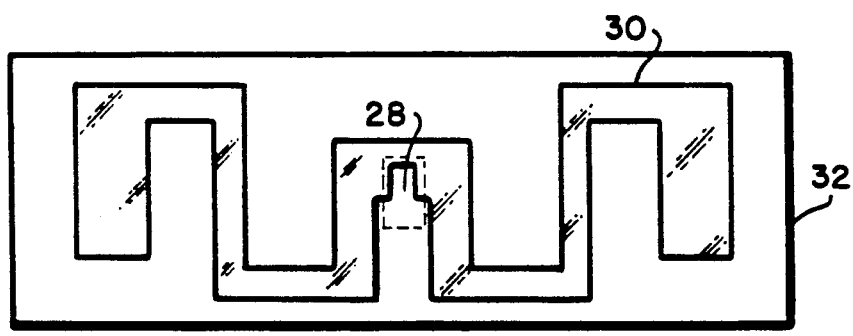
FIG.8a
FIG.8b
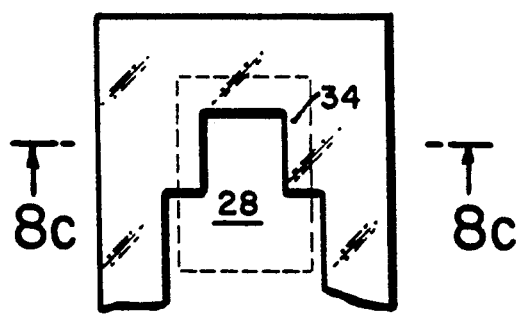

INDUCTIVELY COUPLED SAW DEVICE AND METHOD FOR MAKING THE SAME

BACKGROUND OF THE INVENTION

The present invention relates to apparatus for coupling electrical energy into and/or out of a surface acoustic wave ("SAW") device. More particularly, the present invention relates to apparatus for coupling energy into and out of a SAW device which serves as a transponder in a "passive interrogator label system".

A "passive interrogator label system", so-called, is a radar system utilizing transponders which are capable of receiving an interrogating first signal, processing this signal and transmitting a second signal, in reply, that is derived from the first signal and contains encoded information. Because the encoded information normally includes an identification code that is unique to each transponder, and because the transponders of such a system are relatively light weight and small and may be easily attached to other objects to be identified, these transponders are sometimes referred to as "labels". Furthermore, the transponders, which may be implemented by SAW devices, carry no self-contained power source, such as a battery, that must be periodically replaced. Consequently, these transponders are denominated as being "passive"; hence the name "passive interrogator label system".

Passive interrogator label systems of the type to which the present invention relates are disclosed, for example, in the following U.S. patents:

U.S. Pat. No. 4,737,789 of Paul A. Nysen for "Inductive Antenna Coupling for a Surface Acoustic Wave Transponder";

U.S. Pat. No. 4,703,327 of Anthony J. Rossetti and Paul A. Nysen for "Interrogator/Receiver System for Use With a Remote Transponder"; and U.S. Pat. No. 4,737,790 of Halvor Skeie and Donald Armstrong for "Passive Interrogator Label System with a Surface Acoustic Wave Transponder Operating at its Third Harmonic and Having Increased Bandwidth".

In general, a passive interrogator label system includes an "interrogator" for transmitting a first radio frequency signal; at least one passive transponder which receives this first signal, processes it, and sends back a second radio frequency signal containing encoded information; and a receiver, normally located next to the interrogator, for receiving the second signal and decoding the transponder encoded information.

The passive transponder, as disclosed in these patents, comprises a SAW device and a dipole antenna, either electrically or inductively coupled to the SAW transducers on the SAW device. The dipole antenna is formed by printing conductive ink (e.g. silver) on a substrate in the prescribed antenna pattern, or by stamping a metal foil into the size and shape of the antenna pattern and bonding this foil by heat and pressure to the substrate (e.g. a polyethyline coated Mylar sheet). The antenna with its substrate are therefore relatively flat and, depending upon the radio frequency of operation, is relatively modest in size.

For example, the antenna characteristics required for this application, operating at a frequency of approximately 915 MHz., determine that the antenna be physically approximately one inch wide and three inches long. The SAW device, to which the antenna is coupled, is also placed on the substrate to form the complete assembly or "label".

This flat, card-like structure is ideal for many applications such as identification badges for personnel and ID tags for automobiles, factory parts or the like.

The aforementioned U.S. Pat. No. 4,737,789 describes means for inductively coupling a SAW transponder to an antenna by means of an inductive loop formed by at least one turn of an electrical conductor and having an inductance which is substantially equal to the capacitance presented at the terminals of the SAW device within the frequency range of operation. The two free ends of the loop are electrically connected to the two transducer terminals of the SAW device so that the loop and the device form a resonant circuit at the frequency range of operation.

The U.S. Pat. No. 4,737,789 also describes a package comprising a substrate formed by a Mylar sheet coated on both sides with a polyethyline based, thermally activated adhesive; a SAW device comprising a lithium niobate piezoelectric substrate and a partial turn of a metal foil inductive loop, bonded to the Mylar substrate and electrically connected to the two terminals of the SAW device. This entire assembly is then encapsulated and placed next to an inductive loop which is electrically connected to or formed integrally with the antenna.

While the SAW device and its associated inductive loop, so connected, may be conveniently packaged together in a glass or ceramic envelope to form a separate manufactured unit, which may be then mounted adjacent an antenna structure, this package assembly necessarily requires several manufacturing steps to produce. This package is also relatively thick in its final form. Whereas the physical size of assembly is not significant in many applications, certain applications, such as wallet size ID cards, require the assmebly to be as thin as possible.

SUMMARY OF THE INVENTION

It is a principal object of the present invention to provide a SAW device which may be inductively coupled to a signal source or sink such as an antenna.

It is a further object of the present invention to provide a SAW device of the above noted type which is contained in an extremely small, thin and yet robust package.

These objects, as well as other objects which will become apparent from the discussion that follows, are achieved, in accordance with the present invention, by providing a SAW device having a conductive loop deposited on the active surface of the piezoelectric substrate which is electrically connected at its ends to the two transducer terminals of the device. The conductive loop forms an inductive element for coupling energy into and out of the SAW device. The active surface containing the acoustic paths of the SAW device is protected by a non-conductive cover disposed above, and attached to, the surface by means of an adhesive. This cover may be made of glass, for example.

This device, comprising the SAW substrate with the inductive loop pattern and its associated cover is placed in a protective frame which laterally surrounds the SAW substrate and cover. The protective frame, which may be made of metal to provide resilience, may have the same thickness as the combined thickness of the substrate and cover. This entire package, including the substrate, cover and frame is therefore extremely small in its dimensions and yet mechanically strong and completely passivated and protected against outside elements.

For a full understanding of the present invention, reference should now be made to the following detailed description of the preferred embodiments thereof, taken in conjunction with the accompanying drawings.

BRIEF DESCRIPTION OF THE DRAWINGS

FIG. 7 is a perspective view of the SAW substrate and cover of FIGS. 4–6 assembled together.

FIG. 8(a) is a top-view of the SAW device of FIG. 7 arranged in registration with a dipole antenna to form a transponder.

FIG. 8(b) is a top-view of a highlighted portion of FIG. 8(a) displaying the SAW device and inductive coupling loop of the antenna in further detail.

DESCRIPTION OF THE PREFERRED EMBODIMENTS

Figure 1:
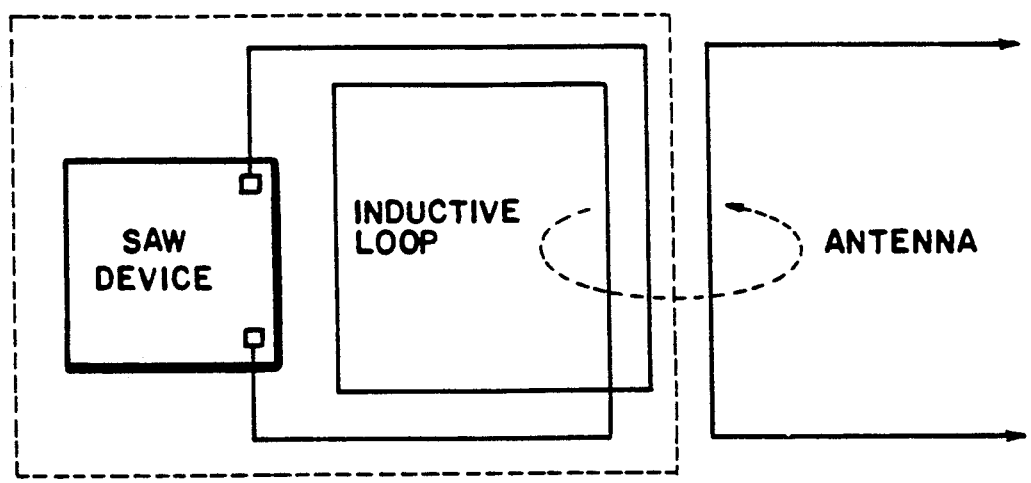
FIG. 1 is a representational diagram of apparatus according to the prior art for coupling a SAW device to an antenna.

The preferred embodiments of the present invention will now be described with reference to FIGS. 1 through 18 of the drawings. Identical elements in the various figures are designated with the same reference numerals.

FIG. 1 illustrates the basic configuration of a passive interrogator label system, with induction input/output coupling so described in the aforementioned U.S. Pat. No. 4,737,789. The design comprises a SAW device having a conductive loop inductively coupled with an antenna. Previously, a SAW device required direct wiring to its dipole antenna, which this design eliminates.

Figure 2:
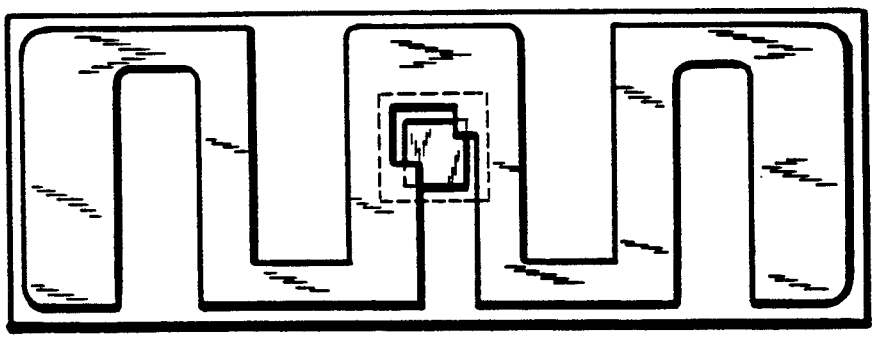
FIG. 2 is a top view of a transponder according to the prior art comprising a SAW device connected to a dipole antenna formed of metal foil and bonded to a Mylar sheet.

An alternative, and direct means for connection to antenna is shown in FIG. 2, whereby the SAW device is connected to several contact pads by physically wiring both together. A dipole antenna, which forms an inductive loop or DC short, is incorporated to prevent the build-up of static electricity.

Figure 3:
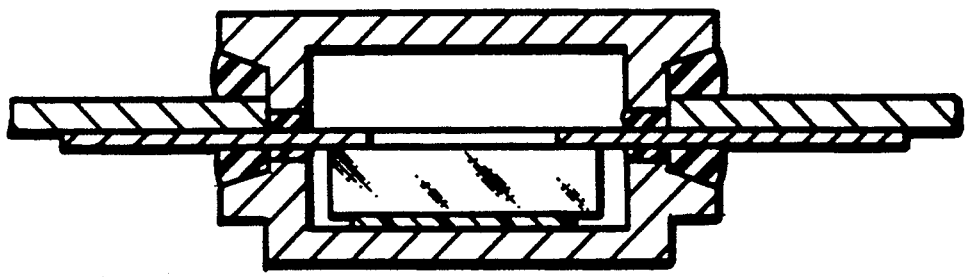
FIG. 3 is a cross-sectional view of a SAW device, as disclosed in the prior art, connected to a metal foil antenna and packaged within a small housing.

Referring to FIG. 3, (cross-sectional view of FIG. 2), the SAW device is encapsulated in a box-like container held together by an epoxy adhesive. This view illustrates the necessity of connecting several leads to a contiguous section to form a DC short between both antenna elements.

Figure 4:
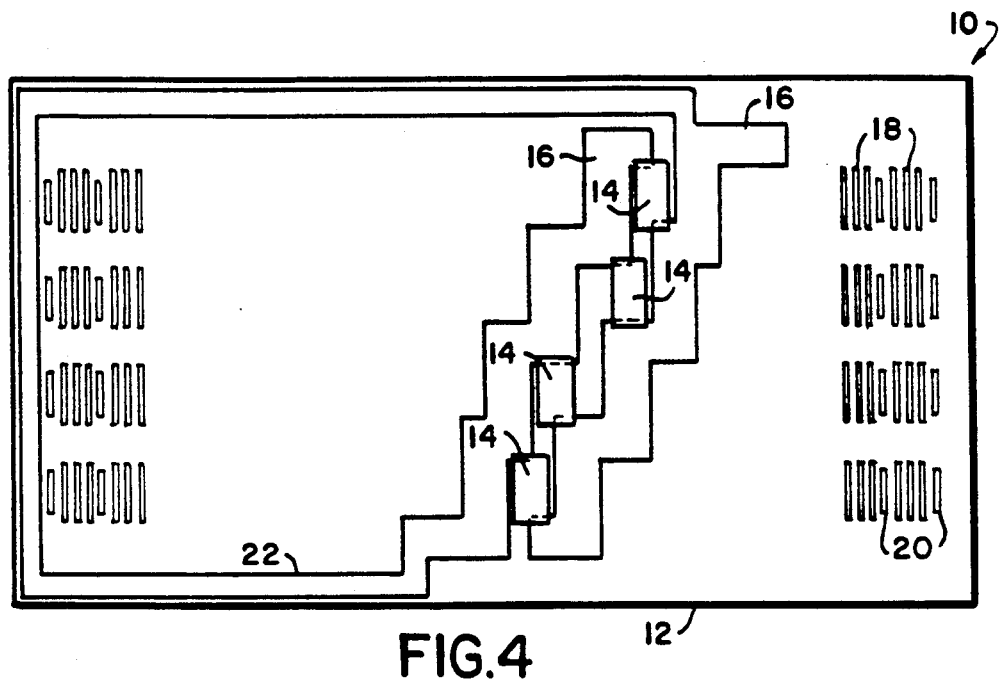
FIG. 4 is a top-view of the SAW substrate surface comprising a multitude of transducers connected to two bus bars, a conductive loop connected to the bus bars, and a multitude of reflectors and delay pads positioned along the surface acoustic wave paths defined by the transducers.

FIG. 4 illustrates a device 10 having a substrate layer 12 comprising a multitude of SAW transducers 14 positioned on the substrate layer 12 with respect to a multitude of reflectors 20 and delay pads 18. Each SAW transducer 14 has a pair reflectors 20 positioned on both sides and is adjoined to a conductive bus bar 16, interconnecting each transducer 14. The conductive bus bars 16 and transducers 14 may be formed from the same conductive material 22, i.e., aluminum. Connected to the bus bars is a U-shaped conductive loop 22, having an approximate thickness of 4,000 Angstroms. The substrate layer 12, upon which all transducers 14 and conductive layers 16 and 22 are disposed, is a piezo-electric material, preferably lithium niobate. This configuration produces a conductive loop 22, which is inductively coupled with a dipole antenna (not shown).

As is the case with most highly sensitive electronic equipment, protection from foreign objects, be it dust particles, fingers or possible shorts, is necessary for consistent and proper operation. The first embodiment discloses a protective means for SAW substrates which by design, eliminates unwanted interference within the acoustic path or paths in order to maintain proper SAW performance.

Figure 5:
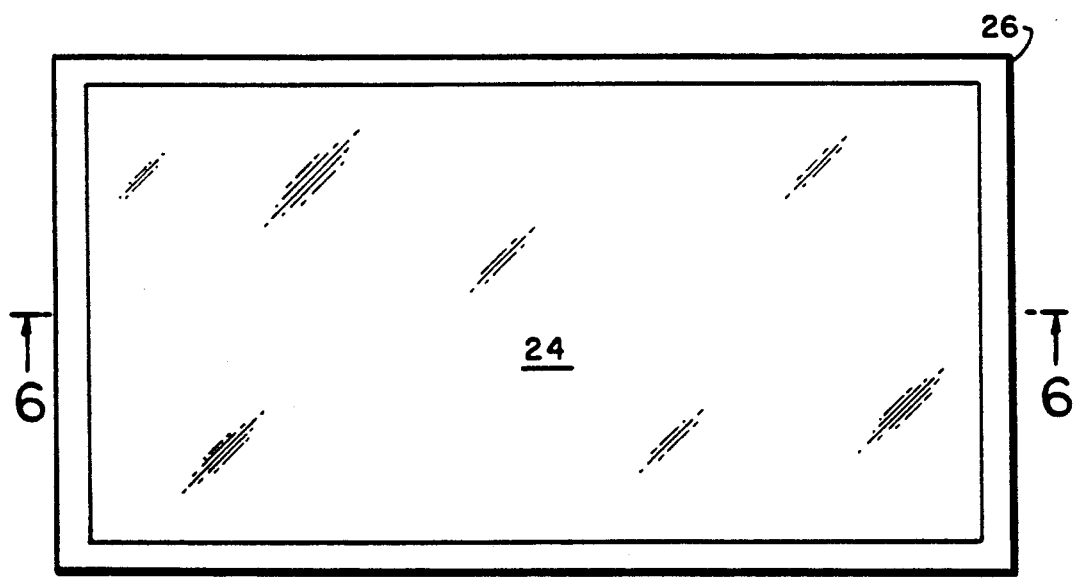
FIG. 5 is a top-view of a non-conductive cover for the substrate of FIG. 4.
Figure 6:
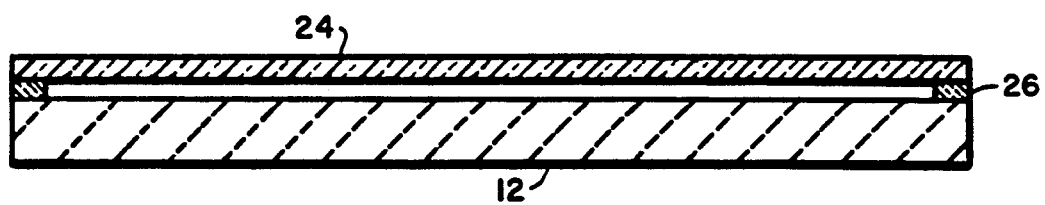
FIG. 6 is a cross-sectional view of a non-conductive cover of FIG. 5 disposed on the SAW substrate of FIG. 4, taken along the section line 6—6 in FIG. 5.

As shown in FIGS. 5, 6 and 7, a non-conductive cover 24 is disclosed, adjoined directly above the SAW substrate layer 12 by means of an adhesive sheet 26. The non-conductive cover 24 acts as a protective means for the substrate surface 12 and maintains the substrate surface's integrity. FIG. 7 is a perspective view of the SAW device 28, encapsulated by the cover 24, substrate layer 12 and adhesive 26. The non-conductive cover should comprise a thickness range of 0.003 to 0.030 inches, and may be formed from glass. Both substrate 12 and non-conductive cover 24 should comprise a lateral width dimension of 0.1 to 0.2 inches and a lateral length dimension of 0.2 to 0.4 inches. The epoxy adhesive 26 should comprise a thickness range of 0.002 to 0.01 inches, and a width of 0.01 to 0.05 inches. A typical adhesive layer used is the 3M brand AF - 42 Film Adhesive for its strong adhesive properties with both glass and metal, and its limited outgassing during curing.

Figure 8C:
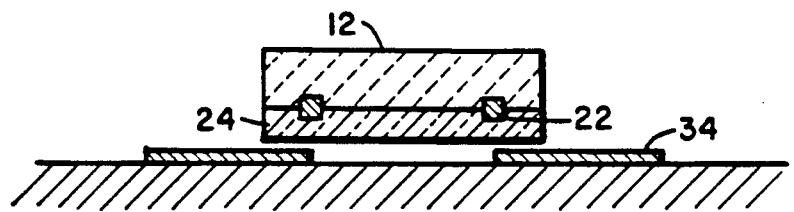
FIG. 8(c) is a cross-sectional view taken along the line 8(c)—8(c) in FIG. 8(b).
Figure 9:
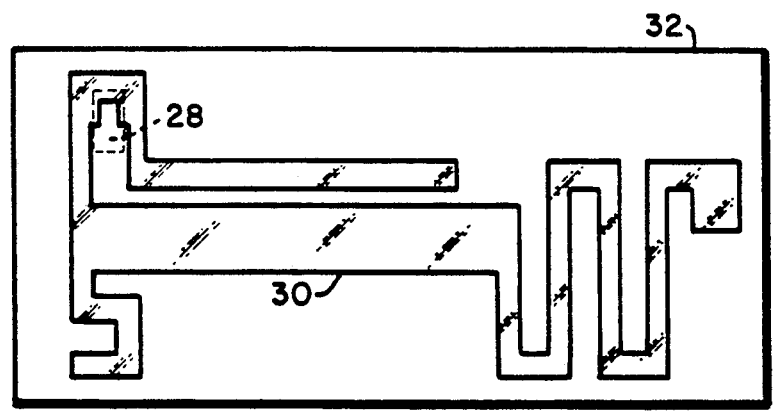
FIG. 9 is a top view of a SAW device disposed in registration with an antenna.

FIGS. 8 (a-c) and 9, illustrates how the SAW device assembly of FIG. 7 must be placed in registration with an inductive loop on an antenna to couple energy between the antenna and the SAW device. FIG. 8(a) illustrates a top view of a SAW device 28 positioned at the center of dipole antenna 30, formed of metal foil or conductive ink. The antenna 30 is disposed on a flat substrate 32, which may comprise polyethyline coated Mylar. The SAW devices's placement is further highlighted in FIG. 8(b). The SAW device 28 is placed in registration with a corresponding loop area 34 on the antenna 30 to provide the inductinve coupling between the antenna and the conductive loop 22 on the devices. A cross-sectional view of the relative positioning and alignment of the SAW device 28 to precisely register the conductive loop 22 with respect to the inductive loop portion 24 of the antenna is shown in FIG. 8(c).

Figure 10A:
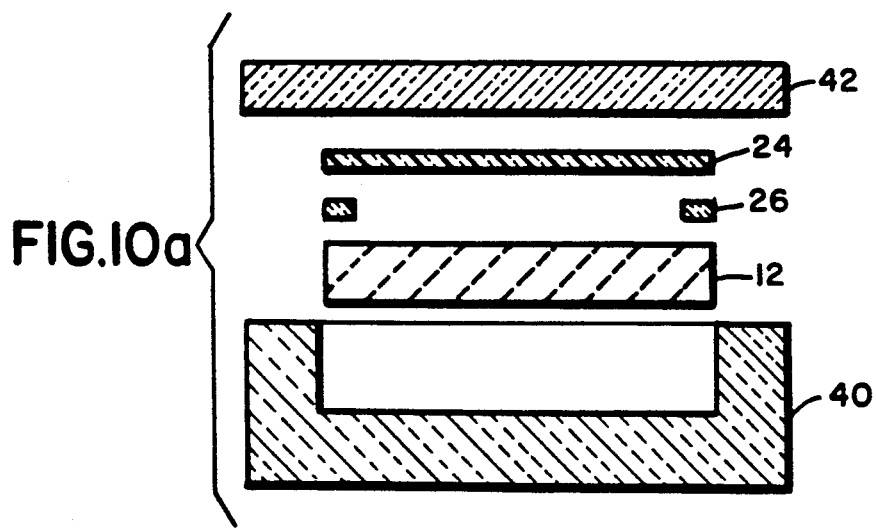
FIGS. 10(a) through 10(c) are representational, cross-sectional views showing the placement of a SAW substrate, an adhesive and a cover layer into a cavity mold, and disposing a squeeze plate on top of the cover to cause the adhesive to properly adhere to the substrate and cover.
Figure 10B:
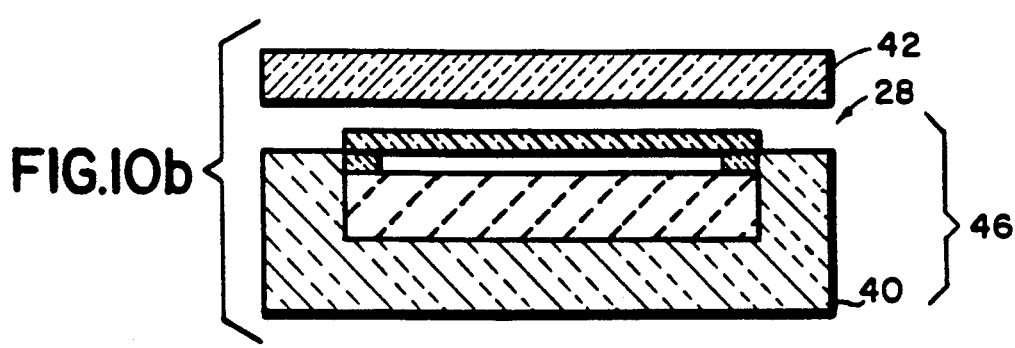
Figure 10C:
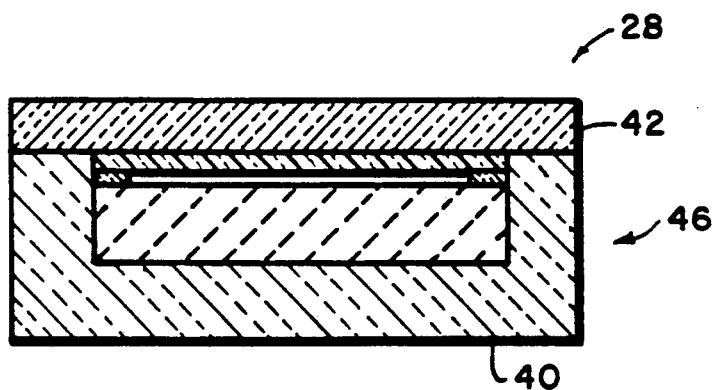
Figure 11:
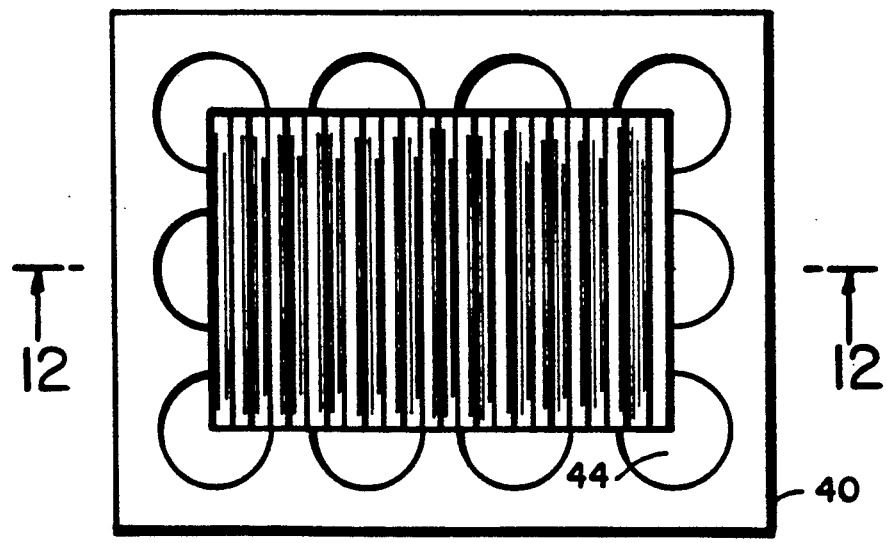
FIG. 11 is a top-view of the cavity mold of FIG. 10.

A second embodiment of the present invention discloses a more complete package, illustrated in FIGS. 10(a-c). Initially, the substrate layer 12 is placed into a cavity mold 40 as shown in FIGS. 10(a) and 11. An adhesive sheet 26, as previously disclosed, is disposed on the substrate layer 12 within the crevices 44 of the cavity mold 40. A non-conductive cover 24 is subsequently placed on top of the substrate layer 12 to form SAW device 28. The configuration of non-conductive cover and substrate layer allows for the transfer of acoustic energy between transducer and reflector, while permitting for the direct protection of the substrate's upper surface. Furthermore, a squeeze-plate, is then applied to the SAW device 28, above the cavity mold 40 to produce an even seal and squeeze any excess adhesive to the outer portions of the cavity mold 40. The unit 46 is then cured at 175° C. for forty-five minutes to hermetically seal the substrate layer. Subsequentally, with the substrate layer 12 adjoined to the non-conductive cover 24, the SAW device 28 can then be removed from the cavity mold 40.

Figure 12:
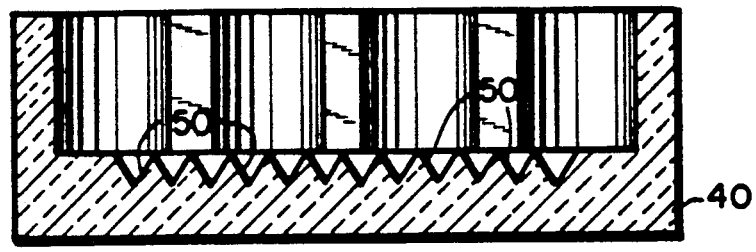
FIG. 12 is a cross-sectional view of the cavity mold of FIG. 11, taken along the lines 12—12 thereof.

As is the case with packaging SAW devices, dust build-up within the cavity mold 40 inhibit the proper settling and positioning of the SAW substrate 12 during the curing process. Referring to FIG. 12, a series of grooves 50 are disclosed on the inner surface of the cavity mold 40 where the substrate layer is to be disposed. This design allows any dust particles to fall within the grooves 50, thereby eliminating any interference with the substrate while being adjoined with the non-conductive cover 24.

Figure 13:
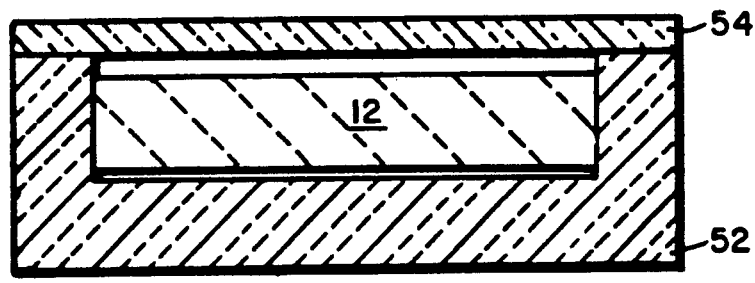
FIG. 13 is a cross-sectional view of a SAW device.
Figure 14:
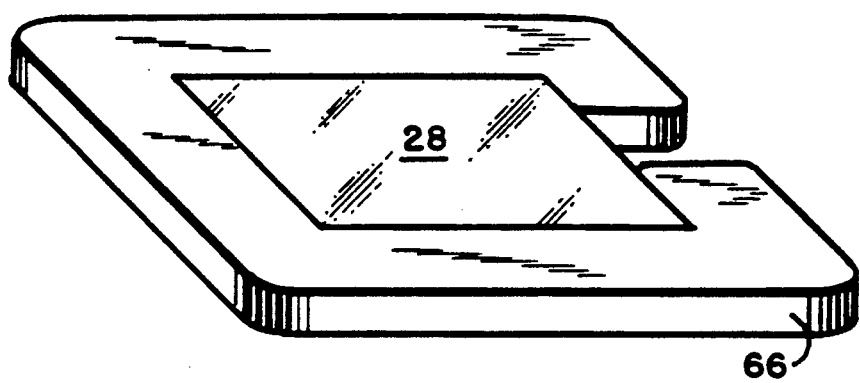
FIG. 14 is a perspective view illustrating a SAW device arranged in a protective frame.
Figure 15:
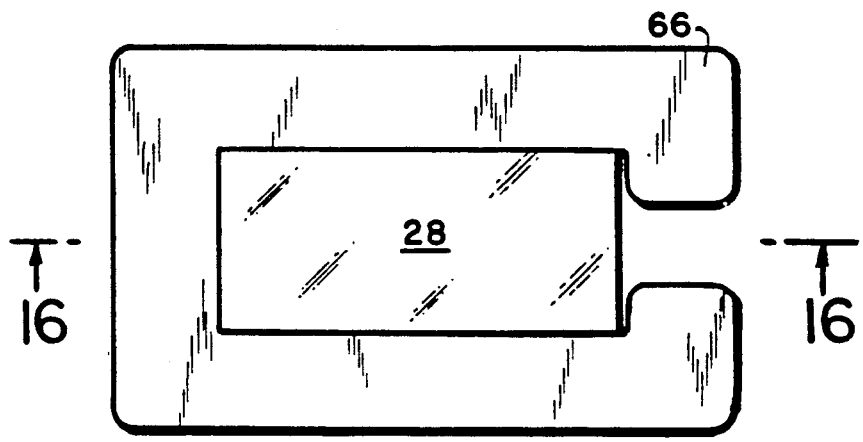
FIG. 15 is a top-view of the SAW device and protective frame of FIG. 14.
Figure 16:
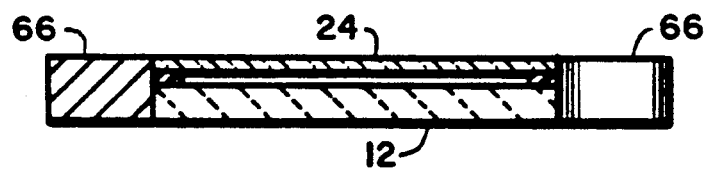
FIG. 16 is a cross-sectional the SAW device and protective frame taken along the line 16—16 in FIG. 15.
Figure 17:
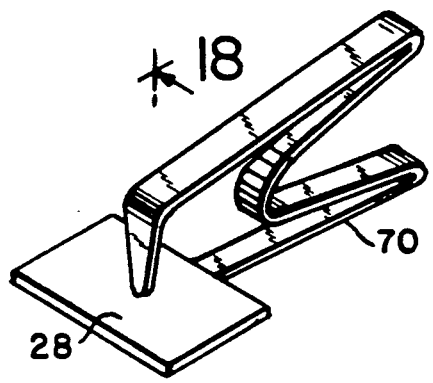
FIG. 17 is a perspective view of a spring clamp suitable for applying pressure to a SAW device during manufacture.
Figure 18:
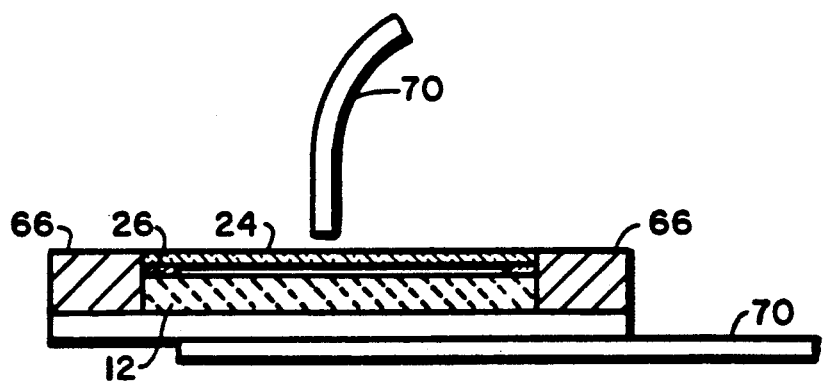
FIG. 18 is a cross-sectional view of the spring clamp of FIG. 17 in a position to apply pressure to the cover of a SAW device.

A packaging alternative is further disclosed, referring to FIG. 13, whereby the substrate layer 12 is placed within a large cavity mold 52, formed from ceramic materials. An adhesive (not shown) is placed on either the bottom portion of the substrate or on its lateral sides, thereby adjoining the substrate layer 12 to the cavity mold 52. A non-conductive cover 54 is further disclosed, which hermetically seals the substrate 12 within the cavity mold 54 during curing.

Another embodiment discloses a packaging alternative illustrated in FIGS. 14-18. A SAW substrate 12 is encapsulated by a frame member 66 formed from a rigid material, such as stainless steel, to provide mechanical support against bending, and protects the edges of the substrate 12 from chipping. The substrate 12 is initially placed within the frame member 66. Subsequently, a non-conductive cover 24 and an adhesive (not shown) may be disposed on portions of the device's upper surface for protection from external elements. Hence, unlike the previous embodiments which utilize a squeeze plate, a one-quarter inch gauge spring clip 70 having one half pound of pressure is can be employed to apply constant, even pressure over the cover and substrate surface in an area outside the acoustic path. Such clips are readily available from RSP Tool Engineering Inc., of Fremont, Calif. It is further noted that a bottom cover or cavity, disposed underneath the substrate, may be used to facilitate further protection. The final package, with spring clips, is subsequently cured.

There has thus been shown and described a novel inductive input/output coupling for a SAW device which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention which is limited only by the claims which follow.

What is claimed is:

1. A surface acoustic wave (SAW) device comprising:
    (a) a SAW substrate having an exposed surface;
    (b) at least one SAW transducer, disposed on said surface of said substrate, for converting between electrical energy and SAW energy that traverses said surface along at least one acoustic path, said transducer having first and second electrical terminals;
    (c) a first conductive, planar loop disposed on said surface of said substrate and electrically connected at its ends to said first and second terminals; and
    (d) a second conductive, planer loop disposed in substantially plane parallel relationship with said first loop, said second loop having third and fourth electrical terminals, said first and second loops forming an inductive element for coupling energy into and out of said SAW device between said third and fourth terminals, on one hand, and said first and second terminals, on the other.

2. The SAW device defined in claim 1, wherein said transducer and said conductive loop are made of the same conductive material.

3. The SAW device defined in claim 2, wherein said transducer and said conductive loop are formed of a metal layer disposed on said substrate.

4. The SAW device defined in claim 3, wherein said metal layer is aluminum.

5. The SAW device defined in claim 3, wherein said metal layer is approximately 4,000 Angstroms thick.

6. The SAW device defined in claim 1, wherein said substrate is lithium niobate.

7. The SAW device defined in claim 1, further comprising a non-conductive cover disposed above said substrate surface for preventing foreign objects from contacting said surface along the acoustic path.

8. The SAW device defined in claim 7, wherein said cover is made of glass.

9. The SAW device defined in claim 8, wherein said glass has a thickness in the range of 0.003 to 0.030 inches.

10. The SAW device defined in claim 7, wherein the lateral edges of said substrate and said cover are substantially coextensive.

11. The SAW device defined in claim 7, wherein said cover is attached to said substrate surface by means of an adhesive.

12. The SAW device defined in claim 11, wherein said adhesive contacts and covers said conductive loop.

13. The SAW device defined in claim 11, wherein said adhesive is disposed between said cover and said substrate.

14. The SAW device defined in claim 13, wherein said adhesive as a thickness, between said cover and said substrate, in the range of 0.002 to 0.010 inches.

15. The SAW device defined in claim 13, wherein said adhesive has a width, in the region between said cover and said substrate, in the range of 0.01 to 0.05 inches.

16. The SAW device defined in claim 12, wherein said adhesive is 3M brand AF - 42 Film Adhesive.

17. The SAW device defined in claim 11, wherein said substrate and said cover have a lateral width dimension in the range of 0.1 to 0.2 inches and a lateral length dimension in the range of 0.2 to 0.4 inches.

18. The SAW device defined in claim 1, further comprising a planar substrate frame member, substantially surrounding said substrate, for protecting said substrate against breakage.

19. The SAW device defined in claim 18, wherein the thickness of said frame member is slightly greater than said substrate.

20. The SAW device defined in claim 19, wherein said frame member has a cover disposed over said substrate surface.

21. The SAW device defined in claim 20, wherein said frame member further comprises a bottom member disposed beneath said substrate.

22. The SAW device defined in claim 7, further comprising a planar substrate frame member substantially surrounding said substrate and said cover.

23. The SAW device defined in claim 22, wherein said frame member has a thickness approximately the same as the combined thickness of said substrate and said cover.

24. The SAW device defined in claim 23, wherein said frame member is adhesively connected with said substrate and said cover.

25. The SAW device defined in claim 22, wherein said frame member includes a gap in its circumference.

26. The SAW device defined in claim 25, wherein said frame member is made of metal.

27. The SAW device defined in claim 26, wherein said metal is stainless steel.

28. The SAW device defined in claim 1, wherein said conductive loop is U-shaped.

* * * * *